United States Patent
Wu et al.

(10) Patent No.: US 6,929,902 B2
(45) Date of Patent: *Aug. 16, 2005

(54) METHOD OF PREVENTING REPEATED COLLAPSE IN A REWORKED PHOTORESIST LAYER

(75) Inventors: Yuan-Hsun Wu, Jungli (TW); Teng-Yen Huang, Taipei (TW); Wen-Bin Wu, Taoyuan Hsien (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 224 days.

This patent is subject to a terminal disclaimer.

(21) Appl. No.: 10/370,441

(22) Filed: Feb. 20, 2003

(65) Prior Publication Data

US 2004/0081923 A1 Apr. 29, 2004

(30) Foreign Application Priority Data

Oct. 24, 2002 (TW) .......................................... 91124766 A

(51) Int. Cl.⁷ ................................................. G03F 7/36
(52) U.S. Cl. .......................... 430/329; 430/313; 134/1.1
(58) Field of Search ................................... 430/311, 313, 430/322, 327, 329; 134/1.1, 1.2, 1.3

(56) References Cited

U.S. PATENT DOCUMENTS

| | | |
|---|---|---|
| 6,218,085 B1 * | 4/2001 | Molloy et al. ............... 430/329 |
| 2002/0123161 A1 * | 9/2002 | Ushiki et al. ................. 438/14 |
| 2003/0087518 A1 * | 5/2003 | Chen et al. .................. 438/637 |

* cited by examiner

Primary Examiner—Kathleen Duda
(74) Attorney, Agent, or Firm—Quintero Law Office

(57) ABSTRACT

A method of preventing repeated collapse in a reworked photoresist layer. First, oxygen-containing plasma is applied to remove a collapsed photoresist. Because the plasma containing oxygen reacts with a bottom anti-reflect layer comprising $SiO_xN_y$, some acids are produced on the bottom anti-reflect layer, resulting in undercutting in a subsequently reworked photoresist. Next, an alkaline solution treatment is performed on the anti-reflect layer after the collapsed photoresist layer is removed. Finally, the reworked photoresist with is formed on the anti-reflect layer, without undercutting.

12 Claims, 2 Drawing Sheets

METHOD OF PREVENTING REPEATED COLLAPSE IN A REWORKED PHOTORESIST LAYER

BACKGROUND OF THE INVENTION

1. Field of the Invention

The invention relates to lithography, and more particularly to a method of reworking a photoresist layer to replace a collapsed photoresist layer.

2. Description of the Related Art

As semiconductor manufacturers have sought to fabricate devices with a higher degree of circuit integration to improve device performance, it has become necessary to use photolithography with shorter wavelengths in the mid and deep UV spectra to achieve fine features. In the process of making the desired very fine patterns, many optical effects are experienced which lead to distortion or displacement of images in the photoresist that are directly responsible for wiring line width variations, opens, and shorts, all of which can lead to deteriorated device performance. Many of these optical effects are attributable to substrate geometry and reflectivity influences that include halation and other reflected light scattering effects which may occur due to uneven topography or the varying (wavelength dependent) reflectivity of the substrates and wires or layers being patterned thereon to define the desired features. Such effects are further exacerbated by both the non-uniformity of the photoresist film and film thickness. These effects are manifested in lithographic patterns; uneven line width, often with "reflective notching", due to standing wave phenomena, and non-vertical pattern side walls. Therefore, the application of an anti-reflect coating (ARC) layer has been developed to impede reflection of the light source and solve standing wave phenomena.

In order to define very fine patterns, such as shallow trenches and contacts, the aspect ratio of the patterns of a photoresist layer is getting higher.

However, collapse problems frequently occur in a photoresist layer due to the high aspect ratio of the patterns. Thus, a reworked photoresist layer is formed after the collapsed photoresist layer is removed by ashing, comprising introducing oxygen-containing plasma to the collapsed photoresist layer. Because the plasma also reacts with the anti-reflect layer, some acids are produced thereon, leading to undercutting in the reworked photoresist layer following formation on the anti-reflect layer.

SUMMARY OF THE INVENTION

Accordingly, an object of the present invention is to provide a method of preventing repeated collapse in a reworked photoresist layer with high aspect ratio patterns.

It is another object of the invention to provide a method of preventing repeated collapse in a reworked photoresist layer to avoid undercutting.

To achieve these and other advantages, the invention provides a method of preventing repeated collapse in a reworked photoresist layer. First, oxygen-containing plasma is applied to remove a defective photoresist layer. Next, an alkaline solution treatment is performed on the anti-reflect coating layer. Finally, a reworked photoresist is formed on the anti-reflect layer without undercut.

According to the present invention, the alkaline solution comprises $NH_4OH$, $H_2O_2$, and $H_2O$ and treatment is preferably performed for 30~60 seconds at about 23~28° C. Furthermore, the component ratio of $NH_4OH:H_2O_2:H_2O$ is about 1:25:25~1:100:100.

The anti-reflect layer comprises $SiO_xN_y$. The method of forming the reworked photoresist layer further comprises the following steps. First, the reworked photoresist layer is coated on the anti-reflect layer. Next, exposure is performed to define patterns of the reworked photoresist layer. Finally, development is performed to form a patterned reworked photoresist layer.

DESCRIPTION OF THE DRAWINGS

For a better understanding of the present invention, reference is made to a detailed description to be read in conjunction with the accompanying drawings, in which.

DETAILED DESCRIPTION OF THE INVENTION

A preferred embodiment of the present invention is now described with reference to FIGS. 1 through 6.

Figure 1:
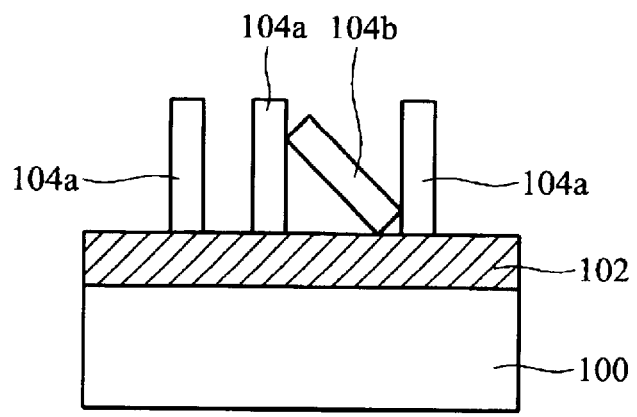
FIGS. 1 through 6 are cross-sections showing a method of preventing repeated collapse in a reworked photoresist layer according to a preferred embodiment of the present invention.

First, as shown in FIG. 1, a substrate 100 with a defective photoresist layer 104a and 104b thereon, such as a collapsed photoresist 104b, is provided. As well, a bottom anti-reflect layer 102 comprising $SiO_xN_y$ is interposed between the substrate 100 and the defective photoresist layer 104a and 104b to reduce reflection and enhance the resolution of the photoresist layer.

Figure 2:
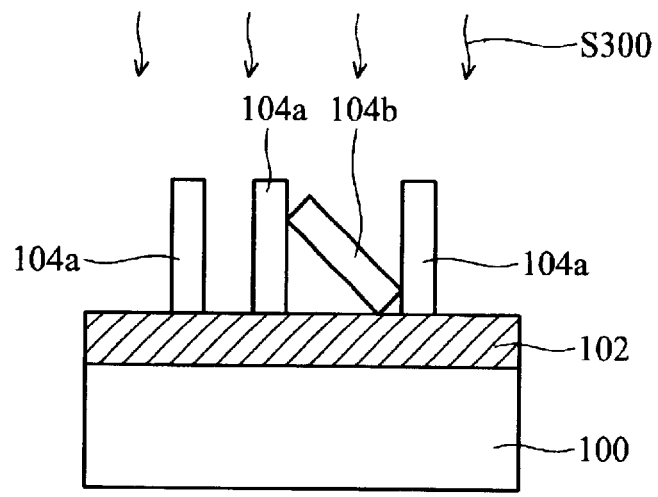

In FIG. 2, oxygen-containing plasma S300 is preferably applied to remove the collapsed photoresist layer 104a and 104b at about 280~320° C. The oxygen flow is about 10~20 slm, and the flow of carrier gas comprising nitrogen is about 100~200 sccm. In the plasma process, the provided power is about 800~1200 W, and the pressure of the plasma is about 10~30 mTorr.

Figure 3:
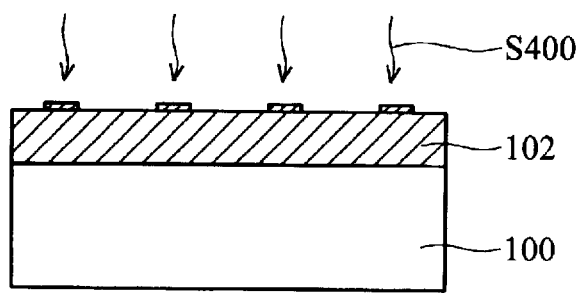
Figure 4:
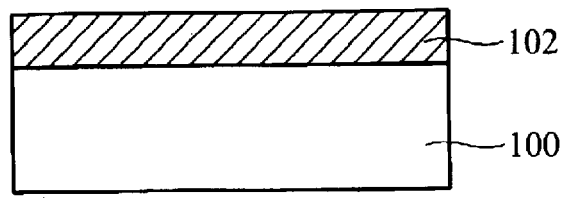

In FIG. 3, an alkaline solution treatment S400 is performed on the anti-reflect layer 102, preferably for 30~60 seconds at about 23~28° C. The alkaline solution comprises $NH_4OH$, $H_2O_2$, and $H_2O$, and the component ratio of $NH_4OH:H_2O_2:H_2O$ is about 1:25:25~1:100:100. Because the plasma containing oxygen S300 can react with the bottom anti-reflect layer 102, some acids are produced on the surface of the bottom anti-reflect layer 102, resulting in undercutting in subesquent reworked photoresist. After the alkaline solution treatment S400 is performed to react with the acids on the surface of the bottom anti-reflect layer 102, the surface of the anti-reflect layer 102 is cleaned, as shown in FIG. 4.

Figure 5:
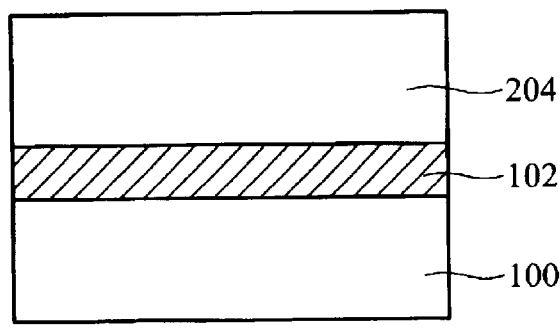

Subsequently, a reworked photoresist layer 204 is formed on the anti-reflect layer 102, preferably by spin coating, as shown in FIG. 5.

Figure 6:
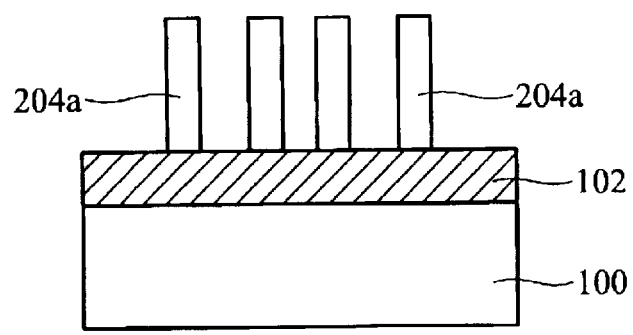

Finally, exposure is performed to define patterns of the reworked photoresist layer 204, and development is performed to form a patterned reworked photoresist layer 204a. Thus, the reworked photoresist layer 204a with high aspect ratio is achieved without undercut and collapse problems, as shown in FIG. 6.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of reducing repeat collapse of a reworked photoresist, for a substrate having a defective photoresist layer, wherein a $SiO_xN_y$ anti-reflect layer is interposed between the substrate and the defective photoresist layer, comprising:

applying oxygen-containing plasma on the substrate to remove the defective photoresist layer and react with the $SiO_xN_y$ anti-reflect layer to generate an acid on a surface of the $SiO_xN_y$ anti-reflect layer;

performing an alkaline solution treatment to react with the acid generated on the surface of the anti-reflect layer; and forming a reworked photoresist on the anti-reflect layer.

2. The method as claimed in claim 1, wherein the alkaline solution comprises $NH_4OH$, $H_2O_2$, and $H_2O$.

3. The method as claimed in claim 2, wherein the component ratio of $NH_4OH:H_2O_2:H_2O$ is about 1:25:25~1:100:100.

4. The method as claimed in claim 1, wherein the alkaline solution treatment is performed for about 30~60 seconds.

5. The method as claimed in claim 1, wherein the alkaline solution treatment is performed at about 23~28° C.

6. The method as claimed in claim 1, wherein formation of the reworked photoresist layer further comprises the following steps:

coating the reworked photoresist layer on the anti-reflect layer;

performing exposure to define patterns of the reworked photoresist layer; and performing development to form a patterned reworked photoresist layer.

7. A method of preventing repeat collapse of a reworked photoresist, for a substrate having a defective photoresist layer, wherein an $SiO_xN_y$ anti-reflect layer is interposed between the substrate and the defective photoresist layer, comprising:

applying oxygen-containing plasma on the substrate to remove the defective photoresist layer and react with the $SiO_xN_y$ anti-reflect layer to generate an acid on a surface of the $SiO_xN_y$ anti-reflect layer;

performing an $NH_4OH$ solution treatment to react with the acid generated on the surface of the anti-reflect layer; and forming a reworked photoresist on the anti-reflect layer.

8. The method as claimed in claim 7, wherein the $NH_4OH$ solution further comprises $H_2O_2$ and $H_2O$.

9. The method as claimed in claim 8, wherein the component ratio of $NH_4OH:H_2O_2:H_2O$ is about 1:25:25~1:100:100.

10. The method as claimed in claim 7, wherein the $NH_4OH$ solution treatment is performed for about 30~60 seconds.

11. The method as claimed in claim 7, wherein the $NH_4OH$ solution treatment is performed at about 23~28° C.

12. The method as claimed in claim 7, wherein formation of the reworked photoresist layer further comprises the following steps:

coating the reworked photoresist layer on the anti-reflect layer;

performing exposure to define patterns of the reworked photoresist layer; and performing development to form a patterned reworked photoresist layer.

* * * * *